United States Patent
Hoshino

(10) Patent No.: US 6,844,725 B2
(45) Date of Patent: Jan. 18, 2005

(54) ELECTRIC AND MAGNETIC FIELD DETECTION DEVICE AND ELECTRIC AND MAGNETIC FIELD MEASUREMENT APPARATUS

(75) Inventor: Shigeki Hoshino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/272,825

(22) Filed: Oct. 18, 2002

(65) Prior Publication Data

US 2003/0076092 A1 Apr. 24, 2003

(30) Foreign Application Priority Data

Oct. 18, 2001 (JP) ........................................ 2001-321244

(51) Int. Cl.$^7$ .......................... G01N 27/72; G01R 33/02
(52) U.S. Cl. ........................ 324/226; 324/227; 324/260
(58) Field of Search ................................ 324/530, 157, 324/260–262, 258, 226, 227, 207.21, 252; 360/326; 338/32 R; 365/158

(56) References Cited

U.S. PATENT DOCUMENTS

| | | | |
|---|---|---|---|
| 4,864,238 A | | 9/1989 | Seitz |
| 5,231,346 A | * | 7/1993 | Gassmann ................... 324/95 |
| 5,365,163 A | * | 11/1994 | Satterwhite et al. .......... 324/67 |
| 5,446,307 A | | 8/1995 | Lux et al. |
| 5,659,248 A | * | 8/1997 | Hedengren et al. ......... 324/242 |
| 5,831,431 A | | 11/1998 | Gottfried-Gottfried et al. |
| 6,275,034 B1 | | 8/2001 | Tran et al. |
| 6,278,271 B1 | | 8/2001 | Schott |
| 6,297,630 B1 | | 10/2001 | Dietzel et al. |
| 6,304,082 B1 | | 10/2001 | Gualtieri et al. |
| 6,380,752 B1 | * | 4/2002 | Irino .......................... 324/755 |
| 6,407,547 B1 | | 6/2002 | Yamada et al. |
| 6,429,763 B1 | | 8/2002 | Patel et al. |
| 6,483,304 B1 | | 11/2002 | Kou et al. |
| 6,522,129 B2 | * | 2/2003 | Miyata et al. ......... 324/207.17 |
| 6,529,019 B1 | * | 3/2003 | King et al. ................. 324/750 |
| 6,583,620 B2 | | 6/2003 | Honda et al. |
| 6,597,315 B2 | | 7/2003 | Yokoshima et al. |

OTHER PUBLICATIONS

Malcovati et al., "An Integrated Microsystem for 3-D Magnetic Field Measurements," IEEE Transactions on Instrumentation and Measurement, vol. 49, No. 2, Apr. 2000, pp. 341–345.

* cited by examiner

*Primary Examiner*—Jay Patidar
*Assistant Examiner*—Reena Aurora
(74) *Attorney, Agent, or Firm*—Young & Thompson

(57) ABSTRACT

The intensity of electric and magnetic component is measured at a high-speed without reducing spatial resolution. An electric and magnetic field detection device has an electric field detection device for detecting an electric field component, and a magnetic field detection device for detecting a magnetic field component. These detection devices are so formed on a multilayer printed circuit board that they can be operated independently.

14 Claims, 7 Drawing Sheets

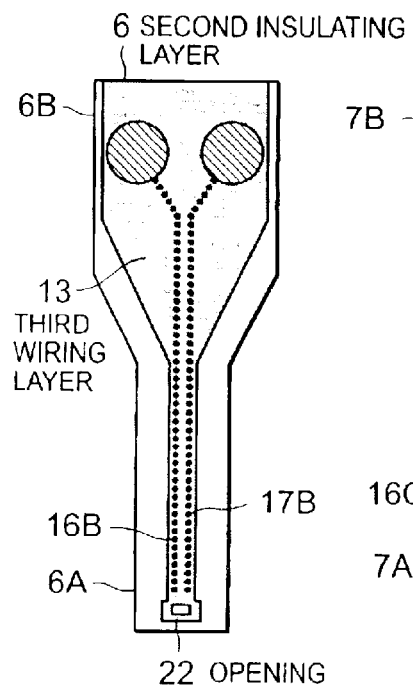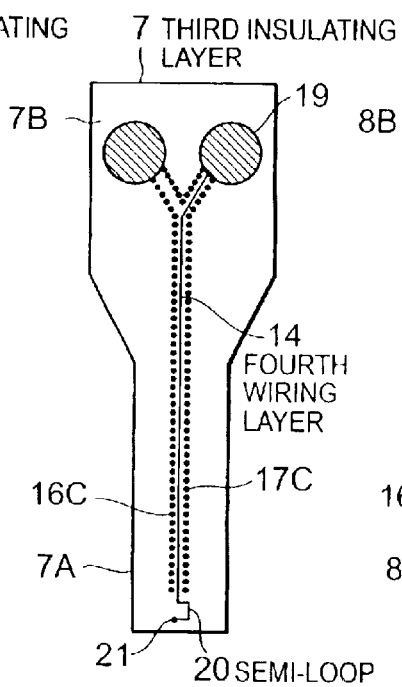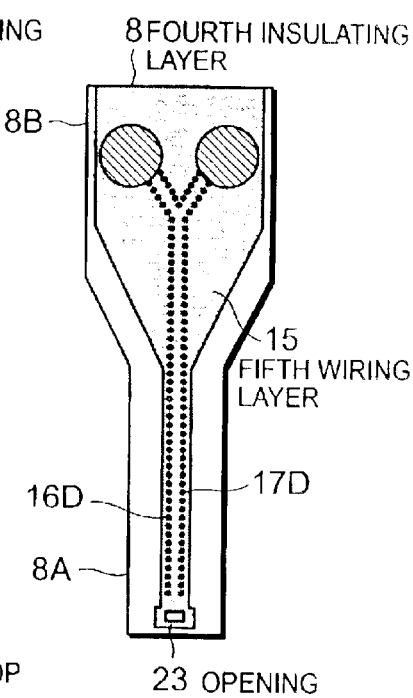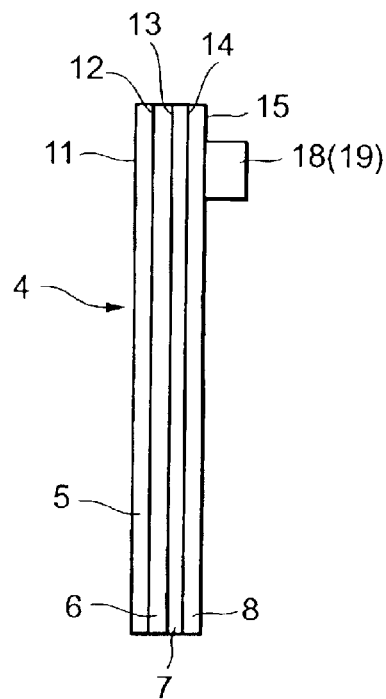

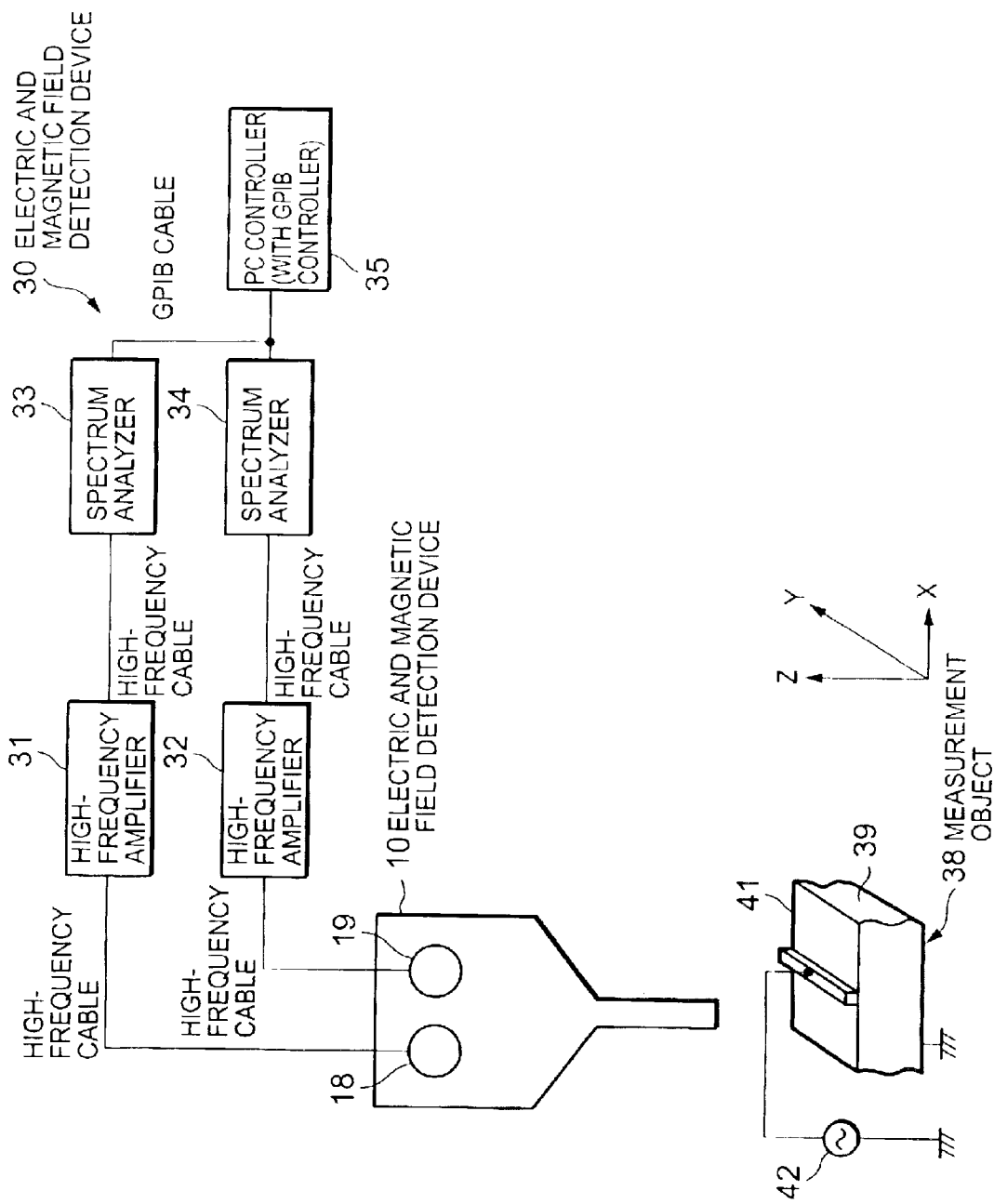

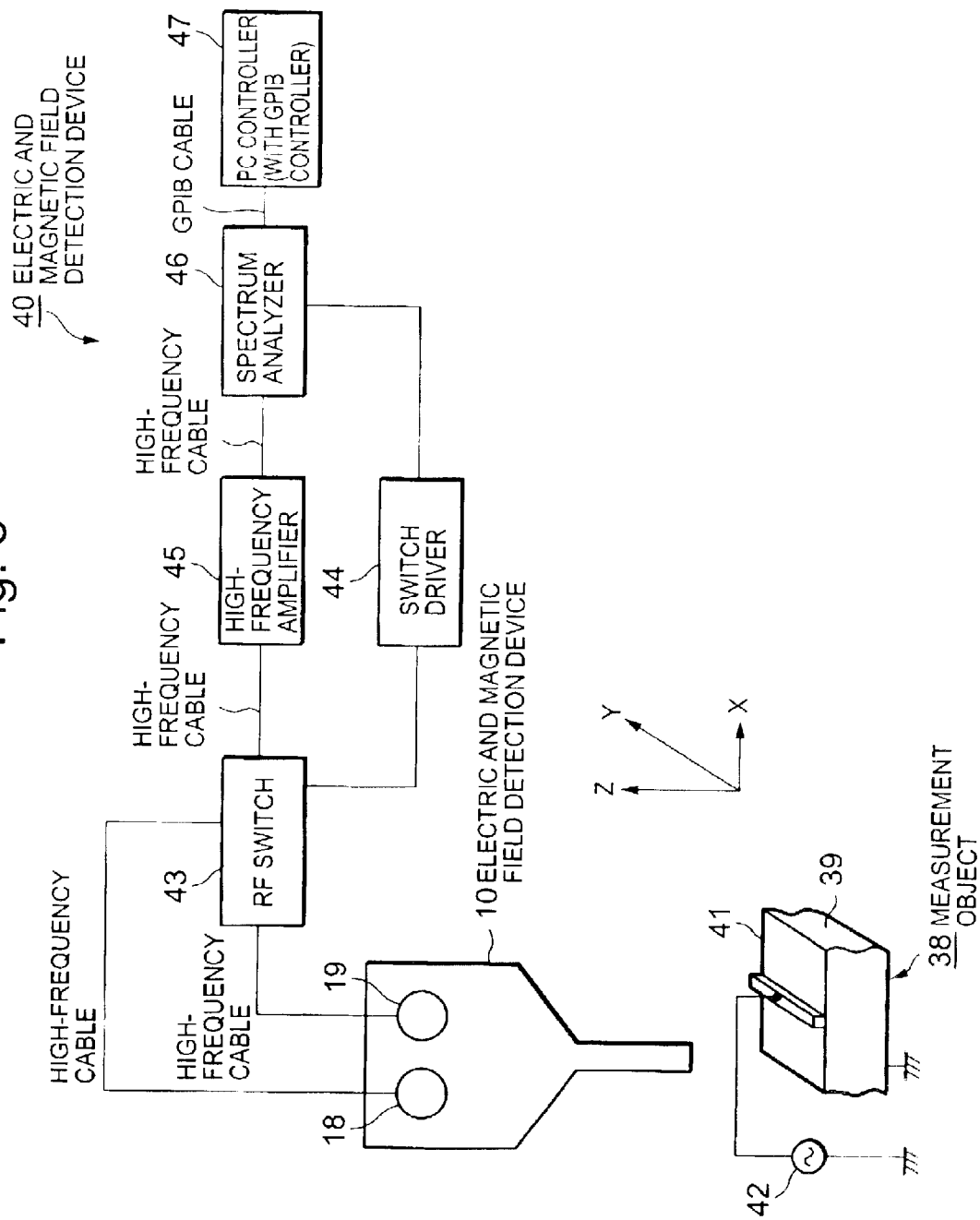

PRIOR ART

ELECTRIC AND MAGNETIC FIELD DETECTION DEVICE AND ELECTRIC AND MAGNETIC FIELD MEASUREMENT APPARATUS

BACKGROUND OF THE INVENTION

1. Field of the Invention

The present invention relates to an electric and magnetic field detection device and an electric and magnetic field measurement apparatus, and, more particularly, to an overall device which has an electric field detection device and a magnetic field detection device in the same body, and to an electric and magnetic field measurement apparatus using the electric and magnetic field detection device.

2. Description of Related Art

When operating a circuit board having various electronic components including an MCM (multi-chip-module) mounted thereon, electric and magnetic fields are generated by the electronic components. Such electric and magnetic fields exert an EMI(Electro-Magnetic-Interference) on surrounding electronic devices. There is a need to detect such electric fields and magnetic fields and to measure the intensity of the electric fields and magnetic fields, to cope with the adverse effect thereof. An electric field detection device and a magnetic field detection device are used for this purpose.

FIGS. 11(a) and 11(b) are schematic plan views of a conventional electric field detection device and magnetic field detection device, respectively. As is shown in FIG. 11(a), the electric field detection device 50 has a semi-rigid cable 51 formed of a coaxial cable, and an end of the core wire 52, or an exposed portion 52A, works as an antenna to detect an electric field. As is shown in FIG. 11(b), the magnetic field detection device 60 is called a printed-circuit substrate type loop and has a loop 64 formed at an end of a wiring 63 formed on a printed-circuit substrate 61. This loop 64 works as a magnetic field detection device.

The electric field detection device 50 and magnetic field detection device 60 are fixed to the sensor attachment of an electric and magnetic field measurement apparatus (not shown) to measure the intensity of an electric field and a magnetic field.

Generally, the electric field and the magnetic field are not measured simultaneously. Therefore, the electric field detection device 50 and the magnetic field detection device 60 are fixed at the attachment alternatively.

SUMMARY OF THE INVENTION

The conventional electric and magnetic field detection devices have problems in the case of detection of electric and magnetic field, as described below.

It is difficult to precisely place an electric field detection device and a magnetic field detection device in the same sensor attachment alternatively without reducing the spatial resolution of the sensor, because the devices have different sizes and shapes in general. It takes a long time to place the device precisely. Therefore, high-speed measurement cannot be achieved.

That is, since it is difficult for the detection devices to be accurately attached to the sensor attachment, the relative positions of these devices are slightly shifted. As a result, the intensities obtained by the sensors will be inaccurate.

Furthermore, since the electric field detection device and the magnetic field detection device must be exchanged, it takes a long time to prepare for the measurements.

Therefore, it is difficult to measure an electric and magnetic field at high speed.

The invention thereby provides an electric and magnetic field detection device and an electric and magnetic field measurement apparatus which can measure the intensity of both the electric field component and the magnetic field component at high speed without reducing the spatial resolution.

To achieve the high speed measurement without reducing the spatial resolution, the present invention related to an electric and magnetic field detection device which detects spatially-distributed electric field components and magnetic field components, and relates to an electric and magnetic field measurement apparatus which measures the intensity of electric field components and magnetic field components using the above-mentioned electric and magnetic field detection device.

The above-mentioned electric field detection device and magnetic field detection device are formed on a multilayer printed circuit board, thereby enabling the electric field detection device and the magnetic field detection device to be independently operated.

BRIEF DESCRIPTION OF THE DRAWINGS

The above and other objects, features and advantages of the present invention will become more apparent from the following detailed description when taken in conjunction with the accompanying drawings wherein:

FIG. 5(a) is a plan view showing part of a third wiring layer on a second insulating layer of a multilayer printed circuit board;

FIG. 5(b) is a plan view showing part of a fourth wiring layer on a third insulating layer of a multilayer printed circuit board;

FIG. 5(c) is a plan view showing part of a fifth wiring layer on a fourth insulating layer of a multilayer printed circuit board;

FIG. 6 is a cross-sectional view showing the construction of the electric and magnetic field detection device along a lengthwise direction of the same;

FIG. 7 is a block diagram showing an arrangement of an electric and magnetic field measurement apparatus which represents a second embodiment of this invention;

FIG. 8 is a block diagram showing an arrangement of an electric and magnetic field measurement apparatus which represents a third embodiment of this invention;

DETAILED DESCRIPTION OF THE PREFERRED EMBODIMENTS

The present invention will now be described in detail below with reference to the accompanying drawings.

<First Embodiment>

Figure 1:
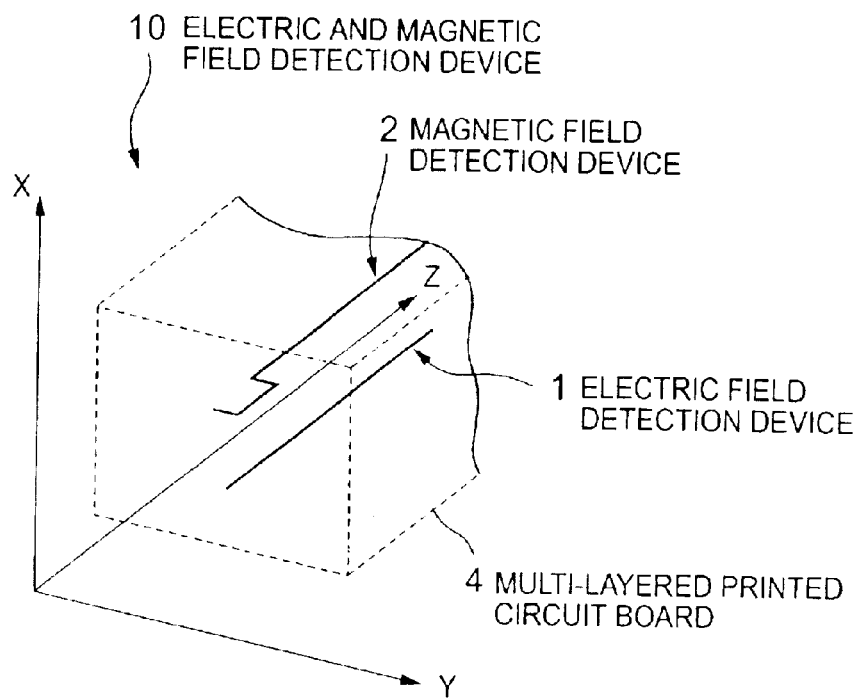
FIG. 1 is a diagram schematically showing a construction of an electric and magnetic field detection device in a first embodiment of this invention.

In the electric and magnetic field detection device 10 of this embodiment, as shown in FIG. 1, there is formed an electric field detection device 1 for detection of an electric field component and a magnetic field detection device 2 for detection of a magnetic field component, on a multilayer printed circuit board 4. The above-mentioned two devices are formed in such a way that the two devices can be independently functioned.

As will be specifically explained later, conductive layers on insulating layers are used as the wirings of the electric field detection device 1 and the magnetic field detection device 2.

Figure 3:
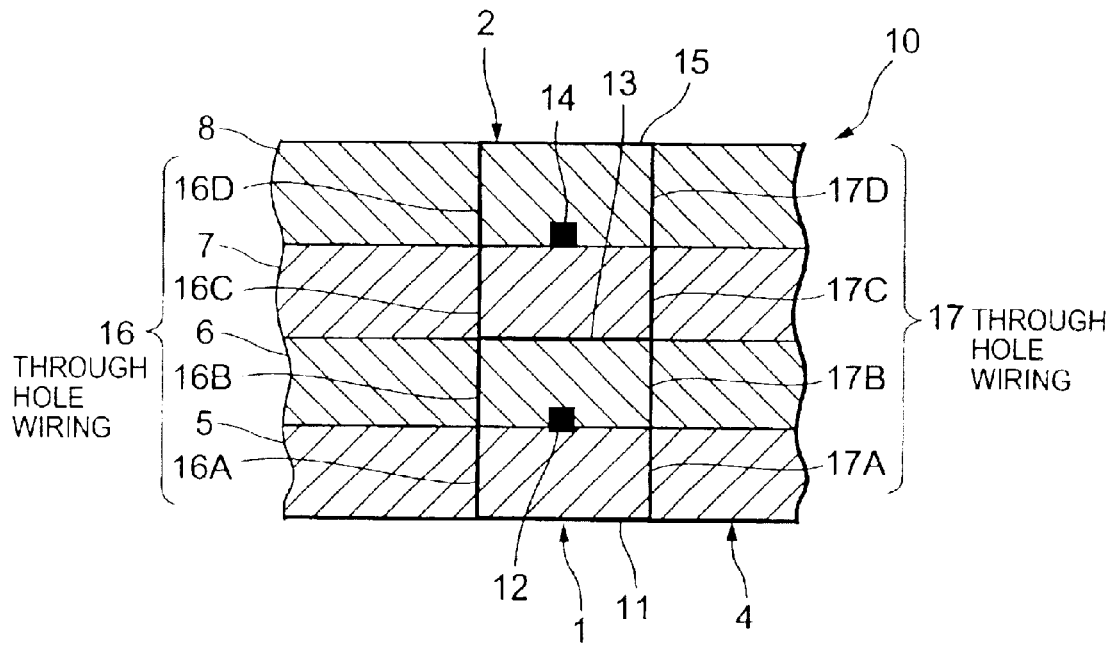
FIG. 3 is a cross-sectional view showing the construction of the electric and magnetic field detection device.

As is shown in FIG. 3, a first insulating layer 5, a second insulating layer 6, a third insulating layer 7 and a fourth insulating layer 8 are laminated to form the multilayer printed circuit board 4. Each of the layer has various patterns which would become a part of the two devices.

Figures 4A, 4B:
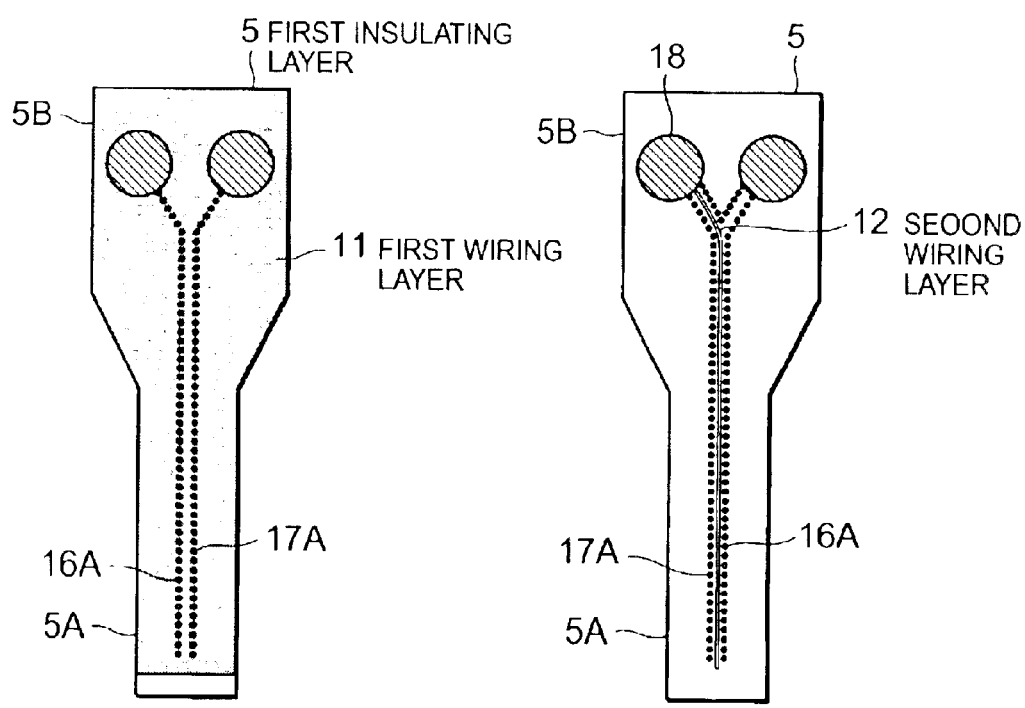
FIG. 4(a) is a plan view showing part of a first wiring layer on a first insulating layer of a multilayer printed circuit board.
FIG. 4(b) is a plan view showing part of a second wiring layer on the other side of the first insulating layer.

As is shown in FIG. 4(a), a first wiring layer 11, which serves as ground wiring, is formed by printing copper or the like. The first wiring layer 11 is a planar wiring (a wiring formed into a planar shape on a surface of a first insulating layer 5) on substantially the entire surface of the first insulating layer 5. The first insulating layer 5 is substantially rectangular with a narrower portion 5A and a wider portion 5B, as shown in FIGS. 4(a) and 4(b). Furthermore, substantially at the center of the surface of the first insulating layer 5, through holes 16A and 17A are arrayed in two lines.

As is shown in FIG. 4(b), a second wiring layer 12 is prepared by linearly printing copper or the like to form planar wiring substantially centered on a side of the first insulating layer 5 opposite the wiring layer 11. The second wiring layer 12 serves as the signal wiring for the electric field detection device 1. The through holes 16A and 17A are, as mentioned above, arrayed in two lines. A connector 18 is also attached to the end of the second wiring layer 12, which serves as the terminal for the electric field detection device. The connector 18 is a coplanar wiring structure. It should be noted that in the drawing the connector 18 is schematically depicted and that in the actual structure it will be positioned differently.

As is shown in FIG. 5(a), a third wiring layer 13, which serves as ground wiring, is prepared by printing copper or the like. The third wiring layer 13 is a planar wiring on the surface of the second insulating layer 6. The second insulating layer 6 has a substantially rectangular shape with a narrower portion 6A and a wider portion 6B, as shown in FIG. 5(a). Further substantially at the center of the surface of the third insulating layer 13, through holes 16B and 17B are arrayed in two lines. The through hole 16B and the through hole 17B contain through hole wiring 16 and through hole wiring 17, respectively. Furthermore, an opening 22 is formed in an end of the third wiring layer 13.

As is shown in FIG. 5(b), a fourth wiring layer 14 is prepared by linearly printing copper or the like, to form planar wiring substantially at the center of the surface of the third insulating layer 7. The third insulating layer 7 has a substantially rectangular shape with a narrower portion 7A and a wider portion 7B, as shown in FIG. 5(b). The semi-loop 20, which may have a half circle or half-rectangle shape, is formed at an end of the fourth wiring layer 14, and the end of the semi-loop 20 is connected to the third wiring layer 13 and the fourth wiring layer 15 by a through hole 21. A part of the semi-loop 20 is arranged to be placed between the opening 22 and the opening 23 that will be described later. As a result, the fourth wiring layer 14 serves as the signal wiring for the magnetic field detection device 2, and a loop for detecting a magnetic field element is formed at its end. In addition, through holes 16C and 17C, which serve as part of the through hole wiring 16 and 17, are formed, in two lines, so that the fourth wiring layer 14 is positioned between the through hole wiring 16 and the through hole wiring 17. Furthermore, a connector 19 is attached to the end of the fourth wiring layer 14, which is the terminal of the magnetic field detection device 2. The through hole 19 is the strip line wiring structure.

As is shown in FIG. 5(c), the fifth wiring layer 15, which serves as ground wiring, is prepared by printing copper or the like, on the surface of the fourth insulating layer 8 to form planar wiring. The fourth insulating layer 8 has a substantially rectangular shape with a narrower portion 8A and a wider portion 8B, as shown in FIG. 5(c). Further, substantially at the center of the surface of the fifth wiring layer 15, through holes 16D and 17D are arrayed in two lines. The through hole 16D and the through hole 17D are consisted of through hole wiring 16, and through hole wiring 17, respectively. Furthermore, an opening 23 is formed at an end of the fifth wiring layer 15. Thus, the fourth insulating layer 8 is arranged essentially the same as the second insulating layer 6.

When the first insulating layer 5 through the fourth insulating layer 8 are laminated in the above manner, the multilayer printed circuit board 4 shown in FIG. 3 is obtained. As a result, on the multilayer printed circuit board 4, the electric field detection device 1 is formed that has the coaxial structure. The second wiring layer 12, which is signal wiring, is enclosed by the first wiring layer 11, the through hole wiring lines 16A and 16B, the third wiring layer 13 and the through hole wiring lines 17B and 17A. The first wiring layer 11, the third wiring layer 13, the through hole wiring lines 16A, 16B, 17A and 17B are electrically interconnected, and function as a shield.

Figure 2A:
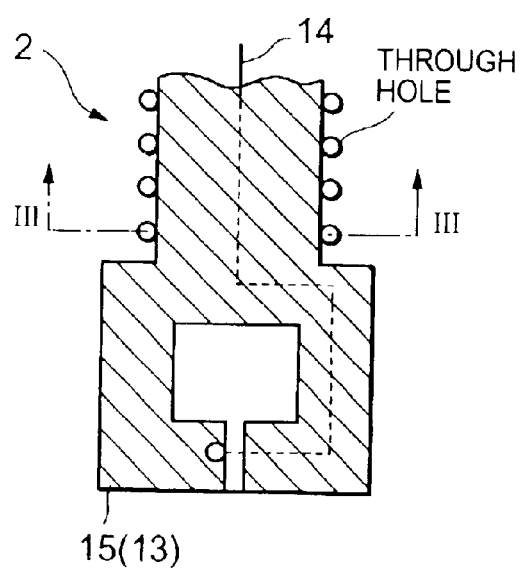
FIG. 2(a) is a schematic plan view showing a part of a magnetic field detection device in a multilayer printed circuit board.
Figure 2B:
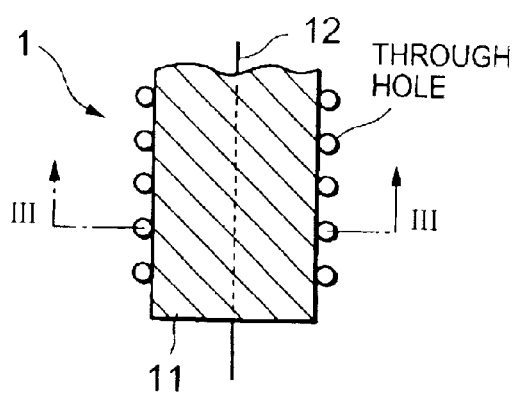
FIG. 2(b) is a schematic plan view showing a part of an electric field detection device in a multilayer printed circuit board.

Further, the magnetic field detection device 2 is formed that has the shielded structure. The fourth wiring layer 14, which is signal wiring, is enclosed by the electrically interconnected third wiring layer 13, the through hole wiring lines 16C and 16D, the fifth wiring layer 15 and the through hole wiring lines 17D and 17C. Since the connector 18 is attached to the electric field detection device 1 and the connector 19 is attached to the magnetic field detection device 2, the electric field detection device 1 and the magnetic field detection device 2 are operated independently. For this reason it is preferable that the through hole wiring lines be arranged at a high density in order to obtain satisfactory shielding effects. In FIG. 6, the longitudinal structure is shown wherein the first wiring layer 11 through the fifth wiring layer 15 are arranged to form the multilayer printed circuit board 4. For the cross-sectional structure of the electric and magnetic field detection device 10 in FIG. 3, the magnetic field detection device 2 and the electric field detection device 1 in FIG. 2, which overlap each other, are cut at the same location along the line III—III. Each through hole wiring 16 and 17 comprises axially aligned segments arranged within through holes 16A–16D and 17A–17D, respectively.

As the material for the first, second, third and fourth insulating layers 5–8, glass epoxy composite, for example, is used. As the first, second, third, fourth and fifth wiring layers 11–15, copper, for example, is used and the wiring is formed to have a film thickness of 5 to 25 $\mu$m. Each of the second and fourth wiring layer 12, 14 functioning as a signal wiring is formed so that its width is 0.1 to 0.2 mm. The semi-loop 20 of the magnetic field detection device 2 is formed so that its opening area is (0.2 to 0.3) mm×(0.3 to 0.5) mm. The through hole for each of the through hole wirings 16(16A, 16B, 16C, 16D) and 17(17A, 17B, 17C, 17D) is formed so that its diameter is 0.1 to 0.2 mm. The small-width and large width portions of the electric and magnetic field detection device 10 are formed so that the size of the small-width portions 5A and 8A is 4 to 6 mm, the size of the large-width portions 5B and 8B is 18 to 22 mm, and the size in the lengthwise direction X is 70 to 90 mm. The wiring structure of each of the signal wiring line 12, the signal wiring line 14, the connector 18 and the connector 19 is set as a strip type having a characteristic impedance of 50Ω. It goes without saying that the above numerical parameters are by way of example only, and may vary considerably in practice.

As is described above, the electric and magnetic field detection device 10 in this embodiment, the electric field detection device 1 and the magnetic field detection device 2 are formed on the multilayer printed circuit board 4 in such positions as to be operated independently. Since the two detection devices are permanently placed in a same body, there is no need to align their relative positions. In addition, being in a small body, the two devices could be fixed at the optimum position for detection.

As a result, above described electric and magnetic field detection device can achieve high speed and high resolution detection.

<Second Embodiment>

FIG. 7 is a block diagram showing the arrangement of an electric and magnetic field measurement apparatus in a second embodiment of this invention. The electric and magnetic field measurement apparatus of this embodiment includes the electric and magnetic field detection device represented in the first embodiment.

The electric and magnetic field measurement apparatus 30 of this embodiment has, as shown in FIG. 7, the electric and magnetic field detection device 10 of this first embodiment, in which the electric field detection device 1, for detecting an electric field component, and the magnetic field detection device 2, for detecting a magnetic field component, are formed in such positions on a multilayer printed circuit board 4 as to be operated independently; first and second high-frequency amplifiers 31–32, which are connected to the electric field detection device 1 and the magnetic field detection device 2, respectively, by high-frequency cables through connectors 18, 19 and which amplify high-frequency signals based on the electric field component and the magnetic field component detected by the detection devices 1 and 2; first and second spectrum analyzers 33–34 which are respectively connected to the first and second high-frequency amplifiers 31–32 by high-frequency cables, and which measure the electric field component and the magnetic field component detected by the detection devices 1 and 2; and a PC (personal Computer) controller (control means) 35 which perform operations for overall control (GPIB (General Purpose-interface Bus) control) including control of first and second high-frequency amplifiers 31–32, and first and second spectrum analyzers 33–34.

The operation of these embodiments of the invention will now be described.

As a measurement object 38, a micro strip line wiring structure is prepared. A signal wiring 41 with film thickness about 20 $\mu$m and film width (a length along the X-axis) about 0.5 mm is formed on an insulating substrate 39. The electric and magnetic field detection device 10 is placed close to this measurement object 38.

As is described above, the electric and magnetic field measurement apparatus 30 of this embodiment comprises the electric and magnetic field detection device 10 of the first embodiment in which the electric field detection device 1 and the magnetic field detection device 2 are formed in such positions on the multilayer printed circuit board 4 as to be operated independently. Since the two detection devices are permanently placed in a same body, there is no need to align their relative positions. Therefore, the electric field detection device and the magnetic field detection device can be very accurately attached to the sensor attachment portion of the measurement apparatus, so that these devices can satisfactorily demonstrate their functions. Further, since the electric field detection device and the magnetic field detection device need not be exchanged, the configuration of the electric and magnetic field measurement apparatus is simplified.

An electric and magnetic field measurement method using the electric and magnetic field measurement apparatus 30 of this embodiment will be described below with reference to FIG. 7.

First, a high-frequency signal 42(500 mV, 100 MHz) is input to the signal wiring film 41 to generate an electric field and magnetic field as measurement object 38. To measure the distribution of the above described electric field and magnetic field, the electric and magnetic field detection device 10 is moved along the X-axis.

Under the control of the PC controller 35, high-frequency signals based on the electric field component and the magnetic field component detected by the electric field detection device 1 and the magnetic field detection device 2 are input to the first and second high-frequency amplifiers 31–32. The signals amplified by the first and second high-frequency amplifiers 31–32 are respectively input to the first and second spectrum analyzers 33–34, and the electric field component along the Z-axis and the magnetic field component along the X-axis or Y-axis are measured. Electric field measurement results and magnetic field measurement results such as those shown in FIGS. 9 and 10 are obtained.

Figure 9:
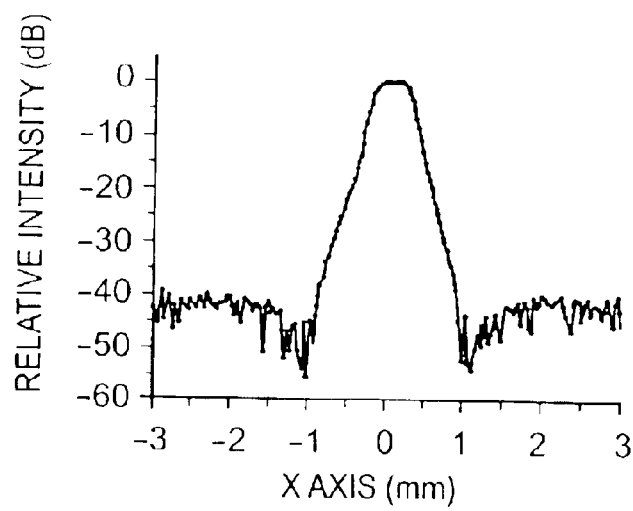
FIG. 9 is a graph showing electric field measurement results obtained by an electric and magnetic field measurement method of this invention.
Figure 10:
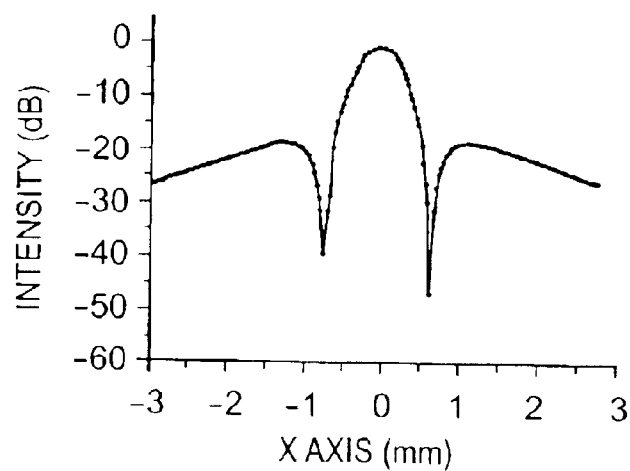
FIG. 10 is a graph showing electric field measurement results obtained by an electric and magnetic field measurement method of this invention.
Figure 11A:
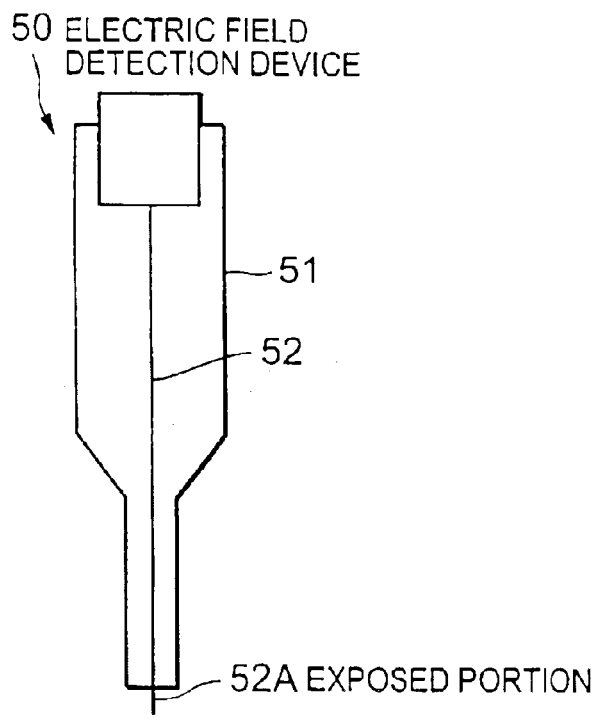
FIG. 11(a) is a schematic plan view of a conventional electric field detection device.
Figure 11B:
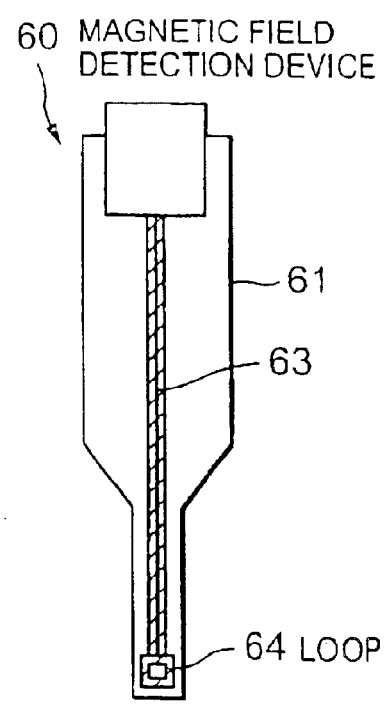
FIG. 11(b) is a schematic plan view of a conventional magnetic field detection device.

In FIG. 9, the ordinate represents the relative strength and the abscissa represents the distance along the X-axis. FIG. 9 shows the intensity of an electric field component Ez obtained by the electric field detection device 1. In FIG. 10, the ordinate represents the output of a spectrum analyzer and the abscissa represents the distance in the X-axis. FIG. 10 shows the intensity of a magnetic field component Hx obtained by the magnetic field detection device 2.

As is described above, according to this measurement method of this embodiment, the electric and magnetic field measurement is performed by using the electric and magnetic field detection device 10 of the first embodiment in which the electric field detection device 1 for detecting an electric field component, and the magnetic field detection device 2 for detecting a magnetic field component, are formed in such a way in the multilayer printed circuit board 4 that they are operated independently. Thus, since the intensities of both the electric field component and the magnetic field component can be measured simultaneously, and the measurement can be performed at high speed.

<Third Embodiment>

FIG. 8 is a block diagram showing the arrangement of an electric and magnetic field measurement apparatus in a third embodiment of this invention. A difference between the third embodiment and the second embodiment resides in a set up enabling the use of a common high-frequency amplifier and a common spectrum analyzer.

The electric and magnetic field measurement apparatus 40 of the third embodiment has, as is shown in FIG. 8, the electric and magnetic field detection device 10 described in the first embodiment; the electric field detection device 1, the magnetic field detection device 2, a switch 43 which is connected to the electric field detection device 1 and the magnetic field detection device 2 by high-frequency cables through connectors 18 and 19, and switches the signals detected by the electric field detection device 1 and the magnetic field detection device 2; a switch driver 44 which controls the switching operation of the switch 43; a high-frequency amplifier 45 which is connected to the switch 43 by a high-frequency cable, and which amplifies each of the high-frequency signals based on electric field components and the magnetic field components detected by the detection devices 1 and 2; a spectrum analyzer 46 which is connected to the high-frequency amplifier 45 by a high-frequency cable, and which measures each of the electric field components and the magnetic field components detected by the detection devices 1 and 2; and a PC controller 47 which perform operations for overall control including control of the switch 43, the switch driver 44, the high-frequency amplifier 45 and the spectrum analyzer 46.

Thus, the electric and magnetic field measurement apparatus 40 of this embodiment is arranged to use a common high-frequency amplifier 45 and a common spectrum analyzer 46, and therefore can be further simplified in structure in comparison with the electric and magnetic field measurement apparatus 30 of the second embodiment An electric and magnetic field measurement method using the electric and magnetic field measurement apparatus 40 of this embodiment will now be described below with referring to FIG. 8.

First, a high-frequency signal 42(500 mV, 100 MHz) is input to a signal wiring 41 to generate an electric field and magnetic field as measurement object 38. To measure the distribution of the above described electric field and magnetic field, the electric and magnetic field detection device 10 is moved along the X-axis, in a similar manner as the second embodiment.

Under the control of the PC controller 47, high-frequency signals based on the distribution of the electric and magnetic field detected by the electric field detection device 1 and the magnetic field detection device 2, are switched by the switch 43 and are amplified by the high-frequency amplifier 45. The amplified signals are input to the spectrum analyzer 46 to measure the intensity of the electric field components and the magnetic field components. The electric and magnetic field measurement results shown in FIGS. 9 and 10 are substantially similar to those obtained by the second embodiment.

The embodiments of the invention have been described in detail with reference to the drawings. However, possible specific arrangements of this invention are not limited to the above-described embodiments. For example, the number of wiring layers, the number of insulating layers, the type of wiring structure, the wiring film thickness, the wiring width, the opening area of the loops, the shape of the multilayer printed circuit board, etc. are by way of example only, and may vary considerably in practice. Furthermore, dielectric substrates (epoxy resin etc.; FR 4) on which wiring pattern is etched may be used as above-mentioned printed circuit board.

According to the electric and magnetic field detection device and the electric and magnetic field measurement apparatus of this present invention, a number of improvements can be obtained. That is, since the electric field detection device and the magnetic field detection device are permanently formed in a same body, there is no need to align their relative positions. Therefore, these devices can perform efficiently and reliably, and the arrangement of the electric and magnetic field measurement apparatus is simplified.

Further, according to the electric and magnetic field measurement method of the invention, intensities of an electric and magnetic field is measured simultaneously, the measurement can be performed at high speed.

What is claimed is:

1. An electric and magnetic field detection device which detects an intensity of electric field and magnetic field comprising:
   an electric field detection device;
   a magnetic field detection device; and
   a multilayer printed circuit board;
   wherein said electric field detection device and said magnetic field detection device are formed in said multilayer printed circuit board;
   wherein at least one of said electric and magnetic field detection devices include a signal conductor surrounded by a shield; and
   wherein said multilayer printed circuit board includes:
   a first layer, a first signal conductor being disposed on an upper surface of the first layer and a first conductive sheet being disposed on a lower surface of the first layer; and
   a second layer, a second conductive sheet being disposed on an upper surface of the second layer so that the first signal conductor is positioned between the first and second conductive sheets;
   wherein each of the first and second conductive sheets is electrically grounded.

2. The electric and magnetic field detection device of claim 1, wherein each of the first and second layers comprises a first set of conductors electrically interconnecting the first and second conductive sheets.

3. The electric and magnetic field detection device of claim 2, wherein the first set of conductors electrically interconnecting the first and second conductive sheets comprise through hole wirings arranged in through holes in the first and second layers, the through hole wirings and the first and second conductive sheets forming the shield surrounding the first signal conductor.

4. The electric and magnetic field detection device of claim 3, wherein the multilayer printed circuit board further comprises:
   a third layer, a second signal conductor being disposed on an upper surface of the third layer; and
   a fourth layer, a third conductive sheet being disposed on an upper surface of the second layer so that the second signal conductor is positioned between the second and third conductive sheets.

5. The electric and magnetic field detection device of claim 4, wherein each of the third and fourth layers comprises a second set of conductors electrically interconnecting the second and third conductive sheets comprising through hole wirings arranged in through holes in the third and fourth layers, the through hole wirings and the second and third conductive sheets forming the shield surrounding the second signal conductor.

6. The electric and magnetic field detection device of claim 1, wherein said multilayer printed circuit board comprises at least five wiring layers.

7. The electric and magnetic field detection device of claim 1, further comprising: at least one connector which connects said detection devices to at least one electronic element located outside said multilayer printed circuit board.

8. The electric and magnetic field detection device of claim 7, wherein each connector is one of a coplanar type, a strip line type and a microstrip line type.

9. A electric and magnetic field measurement apparatus which measures an intensity of electric field and magnetic field, comprising:

an electric and magnetic field detection device of claim 1;

an amplifier connected to at least one of said field detection devices;

a spectrum analyzer connected to said amplifier; and control means for switching and performing said measurement.

10. The electric and magnetic field measurement apparatus of claim 9, wherein said amplifier is connected to all of said field detection devices.

11. The electric and magnetic field measurement apparatus of claim 9, further comprising an additional amplifier, said amplifier and said additional amplifier each being connected to a respective one of said field detection devices.

12. An electric and magnetic field detection device which detects an intensity of electric field and magnetic field comprising:

an electric field detection device;

a magnetic field detection device; and a multilayer printed circuit board;

wherein said electric field detection device and said magnetic field detection device are each at least partly disposed between respective layers of said multilayer printed circuit board.

13. An electric field detection device which detects an intensity of electric field comprising:

an electric field detection device; and a multilayer printed circuit board;

wherein said electric field detection device is formed in said multilayer printed circuit board;

wherein at least one of said electric field detection devices include a signal conductor surrounded by a shield; and wherein said multilayer printed circuit board includes:

a first layer, a first signal conductor being disposed on an upper surface of the first layer and a first conductive sheet being disposed on a lower surface of the first layer; and a second layer, a second conductive sheet being disposed on an upper surface of the second layer so that the first signal conductor is positioned between the first and second conductive sheets;

wherein each of the first and second conductive sheets is electrically grounded;

wherein each of the first and second layers comprises a first set of conductors electrically interconnecting the first and second conductive sheets; and wherein the first set of conductors electrically interconnecting the first and second conductive sheets include through hole wirings arranged in through holes in the first and second layers, the through hole wirings and the first and second conductive sheets forming the shield surrounding the first signal conductor.

14. A magnetic field detection device which detects an intensity of magnetic field comprising:

a magnetic field detection device; and a multilayer printed circuit board;

wherein said magnetic field detection device is formed in said multilayer printed circuit board;

wherein at least one of said magnetic field detection devices include a signal conductor surrounded by a shield; and wherein said multilayer printed circuit board includes:

a first layer, a first signal conductor being disposed on an upper surface of the first layer and a first conductive sheet being disposed on a lower surface of the first layer; and a second layer, a second conductive sheet being disposed on an upper surface of the second layer so that the first signal conductor is positioned between the first and second conductive sheets;

wherein each of the first and second conductive sheets is electrically grounded;

wherein each of the first and second layers comprises a first set of conductors electrically interconnecting the first and second conductive sheets; and wherein the first set of conductors electrically interconnecting the first and second conductive sheets include through hole wirings arranged in through holes in the first and second layers, the through hole wirings and the first and second conductive sheets forming the shield surrounding the first signal conductor.

* * * * *